United States Patent [19]

Namiki et al.

[11] Patent Number: 5,085,969

[45] Date of Patent: Feb. 4, 1992

[54] PHOTOPOLYMERIZABLE IMAGE-RECEIVING SHEET MATERIAL AND PROCESS FOR THE FORMATION OF A TRANSFERRED IMAGE

[75] Inventors: Tomizo Namiki; Tamotsu Suzuki; Fumiaki Shinozaki, all of Shizuoka, Japan

[73] Assignee: Fuji Photo Film Co., Ltd., Kanagawa, Japan

[21] Appl. No.: 494,338

[22] Filed: Mar. 16, 1990

[30] Foreign Application Priority Data

Mar. 17, 1989 [JP] Japan ................................ 1-65064

[51] Int. Cl.$^5$ ...................... G03C 1/90; G03C 1/68; G03C 11/12
[52] U.S. Cl. ................................ 430/260; 430/257; 430/262; 430/263; 430/271; 430/906; 430/905
[58] Field of Search ............... 430/256, 257, 258, 259, 430/260, 262, 263, 271, 905, 906

[56] References Cited

U.S. PATENT DOCUMENTS

| | | | |
|---|---|---|---|
| 3,721,557 | 3/1973 | Inoue et al. | 430/257 |
| 4,482,625 | 11/1984 | Namiki et al. | 430/257 |
| 4,544,619 | 10/1985 | Christensen et al. | 430/256 |
| 4,766,053 | 8/1988 | Shinozaki et al. | 430/257 |
| 4,933,258 | 6/1990 | Shinozaki et al. | 430/260 |

*Primary Examiner*—Richard L. Schilling
*Attorney, Agent, or Firm*—Sughrue, Mion, Zinn, Macpeak & Seas

[57] ABSTRACT

An image-receiving sheet material to be used for the formation of a transferred image by transferring a transferable image formed on an image-forming layer of a photo-sensitive material onto the image-receiving sheet material and then retransferring the image onto a permanent substrate, as well as a process for the formation of a transferred image with the use of the image-receiving sheet material are disclosed.

4 Claims, No Drawings

PHOTOPOLYMERIZABLE IMAGE-RECEIVING SHEET MATERIAL AND PROCESS FOR THE FORMATION OF A TRANSFERRED IMAGE

FIELD OF THE INVENTION

This invention relates to a transfer material which is mainly applied to a color proof for color correction or display.

BACKGROUND OF THE INVENTION

A method is known comprising subjecting a sensitive laminate, wherein a peel layer comprising an organic polymer and a sensitive resin layer are located on a provisional substrate, to exposure and development so as to form an image on the peel layer and then transferring the image onto an arbitrary substrate. These methods are described, for example, in JP-B-46-15326 (the term "JP-B" as used herein means an "examined Japanese patent publication") and JP-B-49-441 (corresponding to U.S. Pat. No. 3,721,557). These methods are advantageous in that they are applicable not only to overlay type processes but also to surprint type processes such as for a color proof. However, they have some disadvantages in that it is required to use an adhesive upon each transfer, which makes the procedure troublesome, and in that the accuracy of site matching upon the transfer of each color is low.

In order to avoid the above-mentioned troublesome procedure, JP-A-47-41830 (The term "JP-A" as used herein means an "unexamined published Japanese patent publication"), JP-A-48-93337 and JP-A-51-5101 each disclose a method wherein an image, which has been formed on an image-receiving sheet, is transferred by applying heat and pressure to the image-forming sheet. JP-A-51-5101, in particular, discloses a method comprising locating a hot-melt polymer layer as an adhesive on a permanent substrate, while JP-A-47-41830 discloses a method whereby an image is directly transferred to a permanent substrate such as art paper or coated paper.

However, these methods have the following disadvantages. One of these disadvantages resides in that the final image thus obtained is in the reverse of its original right and left. Further, the use of the hot-melt polymer having a high melting point elevates the transfer temperature. As a result, the dimensional stability of the substrate is lowered, which causes a deviation in the site matching of the transfer of each color. On the other hand, the use of a polymer having a low melting point frequently causes adhesion or scratches after the formation of an image. JP-A-59-97140 (corresponding to U.S. Pat. No. 4,482,625) discloses a method for improving over these disadvantages.

In this method, an image of each color is transferred once onto a provisional image-receiving sheet provided with a photopolymerizable receiving layer, and then, the image is retransferred onto the permanent substrate and subjected to overall exposure to thereby solidify the photopolymerizable image-receiving layer.

This method is highly effective in solving the above-mentioned problems. Namely, it makes it possible to provide a positive image of the mask original. Furthermore, since an ethylenically polyfunctional monomer is used in this method, the photopolymerizable image-receiving layer per se is soft at the transfer and makes it possible to conduct the transfer at a low temperature. Subsequently, the photopolymerizable receiving layer is solidified through exposure. Thus, the layer has a high resistance against adhesion and scarcely suffers from scratches.

JP-A-61-189535 (corresponding to U.S. Pat. No. 4,766,053) discloses an image-receiving sheet having a two-layer image-receiving layer comprising organic polymers located on a substrate. By using this image-receiving sheet upon the transfer of an image onto a permanent substrate, it may be arbitrarily selected either to transfer the second receiving layer onto the image layer or to transfer the image layer alone, by appropriately controlling the peeling between the receiving layers and that between the second layer and the image layer.

However, this method has the following disadvantages. (1) When the second image-receiving layer is highly adhesive, the image can be transferred well. Upon the retransfer of the image onto the permanent substrate, however, the adhesive from the second image-receiving layer still remains on the image on the permanent substrate. Thus, the final product sometimes suffers from adhesion problems when piled and stored at a high temperature or a high humidity. (2) When the second image-receiving layer is less adhesive, on the other hand, no adhesion problem is observed during the storage of the final product after the retransfer of the image onto the permanent substrate. In this case, however, the transfer properties of the image are poor.

SUMMARY OF THE INVENTION

It is an object of the present invention to improve the above-mentioned disadvantages. Namely, the present invention aims at providing an image-receiving sheet material and a transfer image forming material, each of which has excellent image transfer properties, a high adhesion-resistance of an image retransferred onto a permanent substrate and a good keeping quality, in a process for the formation of a transferred image which comprises transferring a transferable image onto an image-receiving sheet material and conducting interlayer peeling of an image-receiving layer upon the retransfer of the image onto a permanent substrate (for example, paper, metal plate, plastic film, fabric) to thereby give a color image highly approximate to a print and showing the unevenness of the substrate without requiring any matting procedure.

The above-mentioned object of the present invention has been achieved by providing an image-receiving sheet material to be used for the formation of a transferred image by transferring a transferable image formed on an image-forming layer of a photo-sensitive material onto the image-receiving sheet material and then retransferring the image onto a permanent substrate, wherein the image-receiving sheet material comprises a substrate and first and second image-receiving layers located adjacent each other and comprising organic high polymer(s), wherein the second image-receiving layer is to be transferred onto the permanent substrate and further comprises the following components (I), (II), (III) and (IV):

(I) at least one of the organic high polymer;
(II) at least one ethylenically polyfunctional monomer (photopolymerizable monomer) having a boiling point of 150° C. or above under atmospheric pressure;
(III) a photopolymerization initiator; and
(IV) a thermal polymerization inhibitor, if required;

as well as a process for the formation of a transferred image comprising (1) transferring a transferable image formed on an image-forming layer of a photo-sensitive material onto an image-receiving sheet material, (2) retransferring the image onto a permanent substrate, wherein the image-receiving sheet material comprises a substrate and first and second image-receiving layers located adjacent each other and comprising organic high polymer(s); wherein the second image-receiving layer is to be transferred onto the permanent substrate and is photopolymerizable; and (3) adhering the second image-receiving layer, which has received the image, to the permanent substrate; and (4) subjecting the adhered layer to exposure sufficient for inducing polymerization.

DETAILED DESCRIPTION OF THE INVENTION

The substrate of the image-receiving sheet should be made of a flexible material stable to heat and chemicals. It may have a permeability to actinic rays, if required. More particularly, polyolefins (for example, polyethylene, polypropylene), polyvinyl halides (for example, polyvinyl chloride, polyvinylidene chloride), cellulose derivatives (for example, cellulose acetate, nitrocellulose, cellophane), polyamides, polystyrene, polycarbonate, polyimides and paper on which a polyethylene film is laminated may be used therefor. Among these materials, a biaxially oriented polyethylene terephthalate film is particularly preferable from the viewpoints of dimensional stability and permeability, though the present invention is not restricted thereto. It is further possible to subject the substrate to a surface treatment (for example, corona treatment or glow treatment) or to form an undercoat layer so as to enhance the adhesivity of the substrate to the first image-receiving layer. Although any undercoat layer may be used so long as it can enhance the adhesivity of the substrate to the first image-receiving layer, a silane coupling agent is particularly suitable therefor.

The thickness of the substrate of the image-receiving sheet used in the present invention is preferably within the range of 50 to 300 μm.

The organic high polymer to be used in the first image-receiving layer may be preferably selected from among those having a softening point, determined by Vicat's method (ASTMD 1235: Determination of softening point of polymer), of approximately 80° C. or below. This is because the use of a polymer having a low softening point makes it possible to improve the adhesion of an image-receiving sheet material, onto which a transferable image has been transferred, to a permanent substrate such as a paper to which the layer is to be transferred under heat and pressure, since the layer can be embedded along the unevenness of the paper. Furthermore, in this case, no matting step is required upon peeling and the image thus obtained is highly approximate to a printed one. When a polymer of a high softening point is used, on the other hand, the transfer should be conducted at a high temperature, which seriously lowers, for example, the dimensional stability of the image. When a polyethylene terephthalate film is to be used as a substrate for a sensitive material or an image-receiving sheet material, therefore, the organic high polymers should be selected from among those having a softening point of approximately 80° C. or below, preferably 60° C. or below and still preferably 50° C. or below. Examples of organic high polymers having a softening point of approximately 80° C. or below may be selected from among polyolefins (for example, polyethylene, polypropylene), ethylene copolymers (for example, ethylene/vinyl acetate, ethylene/acrylate), polyvinyl chloride, vinyl chloride copolymers (for example, vinyl chloride/vinyl acetate or vinyl chloride/vinyl acetate/maleic acid), polyvinylidene chloride, vinylidene chloride copolymers, polystyrene, styrene copolymers (for example, styrene/(meth)acrylate), polyvinyltoluene, vinyltoluene copolymers (for example, vinyltoluene/(meth)acrylate), poly(meth)acrylates, (meth)acrylate copolymers (for example, butyl (meth)acrylate/vinyl acetate), vinyl acetate, polyamide resins (for example, nylon, copolymers of nylon, N-alkoxymethylated nylon), synthetic rubbers and chlorinated rubbers. Preferred organic high polymers are a vinyl chloride/vinyl acetate copolymer, a vinyl chloride/vinyl acetate/maleic acid copolymer and an ethylene/vinyl acetate copolymer, more preferably, a mixture of the vinyl chloride/vinyl acetate copolymer and the vinyl chloride/vinyl acetate/maleic acid copolymer. Furthermore, organic high polymers having a softening point of approximately 80° C. or below described in *Plastic Performance Handbook* (ed. by The Japanese Plastic Industry Association and the Japanese Plastic Molding Industry Association, published by Industrial Search Co., Oct. 25, 1968) may be used therefor. It is also possible to add various plasticizers compatible with these organic high polymers so as to substantially lower the softening point thereof. It is further possible to add a compatible plasticizer(s) to an organic high polymer having a softening point of approximately 80° C. or above so as to substantially control the softening point thereof to approximately 80° C. or below. Furthermore, it is possible to add various polymers, adhesion improvers, surfactants and/or mold release agents to the first image-receiving layer to thereby control the adhesivity thereof (to the substrate of the image-receiving sheet or to the second image-receiving layer located thereon), so long as the substantial softening point thereof does not exceed approximately 80° C. Typical examples of these additions are described, for instance, in U.S. Pat. No. 4,766,053 and JP-A-1-52135 in detail.

The thickness of the organic high polymer employed as the first layer may preferably range from 1 to 50 μm, still preferably from 5 to 30 μm.

One of the reasons therefor resides in that the thickness of the first layer should exceed the unevenness on the surface of the permanent substrate, when an image transferred onto the image-receiving sheet material is to be retransferred onto the permanent substrate. Another reason therefor is that the first layer is preferably 4 times as thick as that of the unevenness in the streaked part and unstreaked part of each color upon the transfer of a transferable image showing the uneven streaked parts and unstreaked parts onto the image-receiving sheet material, particularly in the case where four colors overlap each other as observed in color proofing, though a thin first layer may be used in the case of a monochrome transfer.

Now the second image-receiving layer to be located on the above-mentioned first image-receiving layer will be described. The purpose of the organic high polymer of the second image-receiving layer is to give an image of gloss closely approximate to that of a print with the use of the unevenness of the permanent substrate, without requiring any particular matting procedure, by conducting interlayer peeling between the first and second image-receiving layers upon the retransfer of the image onto the permanent substrate and leaving the thin second layer alone on the image on the permanent substrate. Therefore, any organic high polymer may be used so long as it satisfies the relationship such that the interlayer peelings are controlled thereby as described in JP-A-61-189535. It is preferable to select an organic high polymer having a softening point higher than that of the first layer by at least 10° C. It should be appropriately selected depending on the material for the first layer, the process for the formation of a transferable image, the material for the image-forming part or the permanent substrate (for example, art paper, coated paper, fine paper, pulp paper, metal plate and synthetic film), by taking the material for the first layer or the process for the formation of a transferable image into consideration.

Particular examples of the organic high polymer (I) to be used as the second image-receiving layer may be selected from among polyolefins (for example, polyethylene, polypropylene), ethylene copolymers (for example, ethylene/vinyl acetate, ethylene/acrylate), polyvinyl chloride, vinyl chloride copolymers (for example, vinyl chloride/vinyl acetate), polyvinylidene chloride, vinylidene chloride copolymers, polystyrene, styrene copolymers (for example, styrene/(meth)acrylate, styrene/maleic acid), polyvinyltoluene, vinyltoluene copolymers (for example, vinyltoluene/(meth) acrylate), poly(meth)acrylates, (meth)acrylate copolymers (for example, butyl (meth)acrylate/vinyl acetate), polyvinyl butylal, vinyl acetate, polyamide resins (for example, nylon, copolymers of nylon, N-alkoxymethylated nylon), acryl resin, synthetic rubbers, chlorinated rubbers and cellulose derivatives. Preferred organic high polymers are a mixture of alcohol-soluble nylon and a styrene/maleic acid copolymer resin, in which the alcohol-soluble nylon is 60% or less, a mixture of alcohol-soluble nylon and polyvinyl butylal, in which the alcohol-soluble nylon is 60% or less, or an acryl resin, more preferably, a mixture of alcohol-soluble nylon and a styrene/maleic acid copolymer resin and a mixture of alcohol-soluble nylon and polyvinyl butylal. The organic high polymer is preferably contaned in the second image-receiving layer in an amount of at least 60 wt %.

Examples of the ethylenically polyfunctional monomer(s) having a boiling point of 150° C. or above under atmospheric pressure (II), the photopolymerization initiator (III) and the thermal polymerization inhibitor (IV) to be used in the present invention are described in detail in U.S. Pat. No. 4,482,625 and JP-A-61-200535 as cited above.

It is also possible to form the third image-receiving layer comprising organic high polymer(s) on the second image-receiving layer so as to control the film properties, for example, adhesiveness, hot-adhesiveness or film strength of the second image-receiving layer. The organic high polymer(s) to be used in the third image-receiving layer may be suitably selected from those as illustrated in the above second image-receiving layer, preferably those having a softing point lower than that of the second layer by at least 10° C.

Needless to say, these resins may contain various additives, for example, adhesion improvers, mold release agents, plasticizers and surfactants so as to satisfy the relationship of the adhesivity specified in JP-A-61-189535.

The thickness of the second layer may preferably range from 0.1 to 10 μm, still preferably from 0.5 to 5 μm. When the film is too thick, the similarity to the unevenness on the surface of the permanent substrate is deteriorated and the excessive gloss thus formed lowers the approximation of the final image to a print. On the contrary, when the film is too thin, the image-transferring properties and the surface gloss of the transferred image are deteriorated due to a low film strength. When two or more image-receiving layers are to be transferred onto the permanent substrate, it is preferable that the total thickness thereof falls within the above range.

As described above, various methods shown in the references cited above (e.g., U.S. Pat. No. 4,482,625) may be employed for the formation of the transferable image to be used in the present invention. It is particularly preferable to use a color material-forming layer wherein a peel layer is placed on a substrate in the thickness of about 0.3 to 5 μm. When there is no peel layer on a substrate upon retransferring, the image per se should be transferred onto the permanent substrate. As a number of tests indicate, the range for selecting the material is considerably restricted and/or a high thermal transfer temperature should be employed in this case. When a peel layer is formed, on the other hand, the functions may be easily divided. Thus, the latitude in temperature or the range of the material of the permanent substrate may be advantageously enlarged. When a photographic image is formed, the peel layer in the unstreaked part may be etched upon development and that in the streaked part may remain alone. Alternately, the peel layer may not be etched upon the development and thus a color image may be formed on the peel layer.

The adhesivities among layers should be well-balanced in order to conduct the interlayer peeling of the image-receiving sheet material between the first image-receiving layer and the second image-receiving layer upon the transfer to the permanent substrate. In order to control the adhesivities among layers, it is effective to use a combination of, for example, a hydrophilic polymer (a polar polymer, for example, polyamide or polyvinyl butylal) with a lipophilic one (a nonpolar one, for example, polyethylene, polystyrene, polyvinyl chloride or ethylene/vinyl acetate copolymer), or to add an adhesion improver (for example, silane coupling agent), various fluorine or silicone additives having a mold releasing effect, a surfactant or a plasticizer to the first or second image-receiving layer, in addition to select an appropriate application solvent so as to prevent the mixing upon the laminate application employed in the present invention.

The photopolymerizable and adhesive image-receiving layer may be solidified by adhering the image-receiving layer, which has received the image, to the permanent substrate and then subjecting the image-receiving layer to an exposure sufficient for inducing the photopolymerization as described, for example, in U.S. Pat. No. 4,482,625. The exposure may be conducted through the substrate of the image-receiving sheet material. Alternately, the image-receiving sheet material may be peeled prior to the exposure and then the exposure is conducted after transferring the image-receiving layer onto the permanent substrate.

To further illustrate the present invention, and not by way of limitation, the following Example will be given. Unless otherwise indicated, all percents, ratios, parts, etc. are by weight.

A transferable image-forming material was prepared in the following manner. A peel layer solution having the following composition was applied on a polyethylene terephthalate substrate (thickness: 100 μm) and dried to thereby give a peel layer of a dry film thickness of 0.5 μm.

| Coating solution for peel layer | |
|---|---|
| Alcohol-soluble polyamide (CM-8000, "η" 20° C., in 10% by weight methanol solution = 23 cps, mfd. by Toray Industries, Inc.) | 7.2 g |
| Polyhydroxystyrene (Resin M, average molecular weight: 5500, mfd. by Maruzen Oil Co., Ltd.) | 1.8 g |
| Methanol | 400 g |
| Methyl cellosolve | 100 g |

Next, four coating solutions of yellow (Y), magenta (M), cyan (C) and black (B), each having the composition specified in Table 1, were applied on the peeling layer and dried. Thus, four photo-sensitive resin layers (dry film thickness: 2.4 μm) were obtained.

TABLE 1

| | Y (g) | M (g) | C (g) | B (g) |
|---|---|---|---|---|
| Benzyl methacrylate/methacrylic acid copolymer (molar ratio: 73/27, viscosity η: 0.12) | 60 | 60 | 60 | 60 |
| Pentaerythritol tetraacrylate | 43.2 | 43.2 | 43.2 | 43.2 |
| Michler's ketone | 2.4 | 2.4 | 2.4 | 2.4 |
| 2-(o-Chlorophenyl)-4,5-diphenyl imidazole dimer | 2.5 | 2.5 | 2.5 | 2.5 |
| Seika First Yellow H-0755 (mfd. by Dainippon Seika Kogyo K.K.) | 9.4 | — | — | — |
| Seika First Carmine 1483 (mfd. by Dainippon Seika Kogyo K.K.) | — | 5.2 | — | — |
| Cyanine Blue 4820 (mfd. by Dainippon Seika Kogyo K.K.) | — | — | 5.6 | — |
| Mitsubishi carbon Black KA-100 (mfd. by Mitsubishi Chemical Industries, Ltd.) | — | — | — | 6.6 |
| Methyl cellosolve acetate | 560 | 560 | 560 | 560 |
| Methyl ethyl ketone | 280 | 280 | 280 | 280 |

Note: Viscosity η means the intrinsic viscosity in a methyl ethyl ketone solution at 25° C.

Further, a coating solution of the following composition was applied on each photo-sensitive resin layer and dried so as to form a protective layer of 1.5 μm in dry film thickness.

| Coating solution for protective layer | |
|---|---|
| Polyvinyl alcohol (GL-05, mfd. by Nippon Gosei Kagaku Kogyo K.K.) | 60 g |
| Water | 970 g |
| Methanol | 30 g |

Thus, photo-sensitive transfer sheets (N→P type colored photo-sensitive sheets) of the four colors, each successively comprising the substrate, the peel layer, the photo-sensitive resin layer and the protective layer, were prepared.

Each of these photo-sensitive transfer sheets was placed on the corresponding mask with register pins and exposed to an ultra-high pressure mercury lamp (2 kW) for 30 seconds placed 50 cm away.

The transfer sheet thus exposed was then developed with the use of a developing solution of the following composition at 35° C. for 10 to 20 seconds. Thus, four color positive images were obtained on the peel layers.

| Developing solution | |
|---|---|
| $Na_2CO_3$ | 15 g |
| Butyl cellosolve | 1 g |
| Water | 1 liter |

On the other hand, an image-receiving sheet material was prepared in the following manner. Coating solutions $A_1$ and $A_2$ of the following compositions for the first image-receiving layer were successively applied on a polyethylene terephthalate film (thickness: 100 μm) and dried to thereby give the first image-receiving layer of a dry film thickness of 20 μm.

| Coating solution $A_1$ | |
|---|---|
| Vinyl chloride/vinyl acetate copolymer (weight ratio: vinyl chloride 75%, vinyl acetate 25%, degree of polymerization: ca. 400, MPR-T5, mfd. by Nisshin Kagaku K.K.) | 15 g |
| Vinyl chloride/vinyl acetate/maleic acid copolymer (weight ratio: vinyl chloride 86%, vinyl acetate 13%, maleic acid 1%, degree of polymerization: ca. 400, MPR-TM, mfd. by Nisshin Kagaku K.K.) | 5 g |
| Butyl phthalate | 0.4 g |
| Fluorine surfactant ("Flolard FC-430, mfd. by 3M Co.) | 0.25 g |
| Methyl ethyl ketone | 100 ml |

| Coating solution $A_2$ | |
|---|---|
| Ethylene/vinyl acetate copolymer (weight ratio: ethylene/vinyl acetate = 81/19, "EVAFLEX #410" mfd. by Mitsui Polychemical Co., Ltd.) | 15 g |
| Chlorinated polyethylene ("SUPERCHLON #907LTA" mfd. by Sanyo-Kokusaku Pulp Co., Ltd.) | 0.075 g |
| Fluorine surfactant ("FLUORAD FC-430, mfd. by 3M Co.) | 0.25 g |
| Toluene | 100 ml |

Next, coating solutions $b_1$, $B_2$ and $B_3$ for the photopolymerizable second image-receiving layer of the present invention were applied onto the above-mentioned first image-receiving layer and dried to thereby give the second image-receiving layer of a dry film thickness of 2 μm.

| Coating solution $B_1$ | |
|---|---|
| Alcohol-soluble nylon (AMILAN "CM-8000" mfd. by Toray Industries, Inc.) | 1.5 g |
| Styrene/maleic acid semiester copolymer resin ("Oxylac SH-101" mfd. by Nippon Shokubai K.K.) | 1.5 g |

-continued

| | |
|---|---|
| Pentaerythritol tetraacrylate | 2.1 g |
| Michler's ketone | 0.02 g |
| Benzophenone | 0.13 g |
| Methanol | 70 ml |
| Methyl cellosolve | 30 ml |
| Coating solution B$_2$ | |
| Alcohol-soluble nylon | 1.5 g |
| (AMILAN "CM-4000" mfd. by Toray Industries, Inc.) | |
| Polyvinylbutyral | 1.5 g |
| ("S-LEC BL-1" mfd. by Sekisui Chemical Co., Ltd.) | |
| Trimethylol propane triacrylate | 2.1 g |
| Michler's ketone | 0.02 g |
| Benzophenone | 0.13 g |
| Methanol | 70 ml |
| Methyl cellosolve | 30 ml |
| Coating solution B$_3$ | |
| Acryl resin | 3.0 g |
| ("DIANAL BR-102" mfd. by Mitsubishi Rayon Co., Tg: 20° C., m.w.: 360,000) | |
| Dibutyl phthalate | 0.6 g |
| Trimethylol propane triacrylate | 2.1 g |
| Michler's ketone | 0.02 g |
| Benzophenone | 0.13 g |
| Isopropyl alcohol | 50 ml |
| n-Butyl alcohol | 50 ml |

Further, a comparative sample was prepared by using the following coating solutions b$_1$ and b$_2$ containing no photopolymerizable component.

| | |
|---|---|
| Coating solution b$_1$ | |
| Alcohol-soluble nylon | 1.5 g |
| (AMILAN "CM-8000" mfd. by Toray Industries, Inc.) | |
| Styrene/maleic acid semiester copolymer resin | 1.5 g |
| ("Oxylac SH-101" mfd. by Nippon Shokubai K.K.) | |
| Methanol | 70 ml |
| Methyl cellosolve | 30 ml |
| Coating solution b$_2$ | |
| Alcohol-soluble nylon | 1.5 g |
| (AMILAN "CM-4000" mfd. by Toray Industries, Inc.) | |
| Polyvinyl butylal | 1.5 g |
| ("S-LEC BL-1" mfd. by Sekisui Chemical Co., Ltd.) | |
| Methanol | 70 ml |
| Methyl cellosolve | 30 ml |

Next, the black image side of the color proofing sheet, on which a black image had been formed, was exactly placed upon the image side of the image-receiving sheet of the present invention or the comparative sheet with register pins. Then the black image was transferred onto each image-receiving sheet by using a color art transferor (CA-600T, mfd. by Fuji Photo Film Co., Ltd.). Thus, the black image was completely transferred together with the peel layer from the color proofing sheet onto the image-receiving sheet.

Then, each of the above-mentioned color proofing sheets having cyan, magenta and yellow images was placed on the black image thus transferred and the same procedure repeated. As a result, each color image was completely transferred together with the peel layer onto the image-receiving sheet. Thus, a four-color image was formed.

Furthermore, the image side of the image-receiving sheet having the transferred four-color image thus obtained was placed on white art paper and the above transferring procedure was carried out using a color art transferor (CA 600T). Next, the photopolymerizable sample of the present invention was subjected to exposure for 30 seconds from the base side of the image-receiving sheet with the use of a daylight film contact reversal printer (P-607, mfd. by Dainippon Screen Co., Ltd., 1 kW ultra-high pressure mercury lamp) placed 50 cm away. After peeling the image-receiving sheet material, the first image-receiving layer remained alone on the substrate. Namely, the image and the second image-receiving layer located thereon were formed and transferred onto the permanent substrate.

In order to confirm the photosetting effect, the same sample was prepared without exposing. When the substrate of the image-receiving sheet was peeled, in this case, the first image-receiving layer remained alone on the substrate while the image and the second image-receiving layer located thereon were formed and transferred onto the permanent substrate.

The following Table 2 shows the transfer properties of each image and the degree of adhesion of the image side of a white art paper to another white art paper when piled and stored for 72 hours at 40° C., at a relative humidity of 75% and under a load of 1.5 kg/5×5 cm$^2$.

As Table 2 obviously indicates, the sample of the present invention, wherein the photopolymerizable second image-receiving layer was photoset by exposure after transferring the image, exhibited excellent transfer properties of the image, a high resistance to adhesion of the final product and a good keeping quality.

TABLE 2

| | Image-receiving layer (1) | Image-receiving layer (2) | Exposure | Transfer Properties (Image-receiving layer) | (Art paper) | Adhesion resistance | Approximation to print (surface gloss) |
|---|---|---|---|---|---|---|---|
| Example 1 | A$_1$ | B$_1$ | yes | o | o | o | o |
| Example 2 | A$_1$ | B$_2$ | yes | o | o | o | o |
| Example 3 | A$_2$ | B$_1$ | yes | o | o | o | Δ |
| Example 4 | A$_1$ | B$_3$ | yes | Δ o | Δ | o | o |
| Example 5 | A$_2$ | B$_3$ | yes | Δ o | Δ | o | Δ |
| Comparative Example 1 | A$_1$ | b$_1$ | no | Δ | Δ | o | o |
| Comparative Example 2 | A$_1$ | b$_2$ | no | Δ | Δ | o | o |
| Comparative Example 3 | A$_1$ | B$_1$ | no | o | o | X | o |
| Comparative Example 4 | A$_1$ | B$_2$ | no | o | o | X | o |

Evaluation of Table 2:
(1) The use of B$_3$ as the second image-receiving layer results in poor transfer properties, compared with B$_1$ and B$_2$.
(2) The use of A$_2$ as the first image-receiving layer results in a soft final product which is excessively sensitive to the unevenness of paper. Thus, the approximation to a practical print (surface gloss) becomes poor in this case.

(3) No monomer is added to the second image-receiving layer, thus hot adhesion is lowered.

(4) No post exposure is conducted and thus the monomer is not set.

Thus, it is preferable from the viewpoint of transfer properties that the first image-receiving layer is soft. When taking the factor shown in (2) and workability into consideration, however, $B_1$ or $B_2$ is preferable.

While the invention has been described in detail and with reference to specific examples thereof, it will be apparent to one skilled in the art that various changes and modifications can be made therein without departing from the spirit and scope thereof.

What is claimed is:

1. An image-receiving sheet material to be used for the formation of a transferred image by transferring a transferable image formed on an image-forming layer of a photo-sensitive material onto said image-receiving sheet material and then retransferring said image onto a permanent substrate, wherein said image-receiving sheet material comprises a substrate and first and second image-receiving layers located adjacent each other and comprising organic high polymer(s), wherein said second image-receiving layer is to be transferred onto the permanent substrate and further comprises the following components (I), (II) and (III):

(I) at least one of said organic high polymers;
   (II) at least one ethylenically polyfunctional monomer having a boiling point of 150° C. or above under atmospheric pressure; and
   (III) a photopolymerization initiator;

wherein said organic high polymer present in the first image-receiving layer is at least one vinyl acetate copolymer selected from the group consisting of a vinyl chloride/vinyl acetate copolymer, a vinyl chloride/vinyl acetate/maleic acid copolymer and an ethylene/vinyl acetate copolymer, and wherein said organic high polymer present in the second image-receiving layer is a mixture of alcohol-soluble nylon and a styrene-maleic acid copolymer resin, a mixture of alcohol-soluble nylon and polyvinyl butylal or an acryl resin; and wherein delamination occurs between said first image-receiving layer and said second image-receiving layer.

2. An image-receiving sheet material as claimed in claim 1, wherein said second image-receiving layer further comprises a component (IV) which is a thermal polymerization inhibitor.

3. An image-receiving sheet material as claimed in claim 1 or 2, wherein said vinyl acetate copolymer is a mixture of said vinyl chloride/vinyl acetate copolymer and said vinyl chloride/vinyl acetate/maleic acid copolymer.

4. An image-receiving sheet material as claimed in claim 1 or 2, wherein said organic high polymer is a mixture of alcohol-soluble nylon and a styrene/maleic acid copolymer resin or a mixture of alcohol-soluble nylon and polyvinyl butylal.

* * * * *